United States Patent
Dunbar et al.

(10) Patent No.: US 6,949,296 B2
(45) Date of Patent: *Sep. 27, 2005

(54) POLYIMIDE SUBSTRATES HAVING ENHANCED FLATNESS, ISOTROPY AND THERMAL DIMENSIONAL STABILITY, AND METHODS AND COMPOSITIONS RELATING THERETO

(75) Inventors: Meredith L. Dunbar, Canal Winchester, OH (US); James R. Edman, Circleville, OH (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 156 days.

This patent is subject to a terminal disclaimer.

(21) Appl. No.: 10/407,582

(22) Filed: Apr. 4, 2003

(65) Prior Publication Data

US 2004/0126600 A1 Jul. 1, 2004

Related U.S. Application Data

(60) Provisional application No. 60/437,308, filed on Dec. 31, 2002.

(51) Int. Cl.$^7$ .......................... B32B 27/00; C08G 73/10
(52) U.S. Cl. .................. 428/473.5; 428/411.1; 428/457; 428/458; 428/901; 528/170; 528/322; 528/353; 264/172.19; 264/173.1; 264/173.15; 264/175; 264/177.17; 264/212; 264/239; 264/241; 264/259; 264/271.1; 264/272.17; 264/288.4; 264/290.2; 264/291; 264/319; 264/444; 264/471

(58) Field of Search .............. 428/473.5, 411.1, 428/457–458, 901; 264/172.19, 173.1, 173.15, 175, 212, 239, 241, 259, 444, 471, 291, 290.2, 319, 288.4

(56) References Cited

U.S. PATENT DOCUMENTS

| | | | |
|---|---|---|---|
| 4,725,484 A | | 2/1988 | Ube et al. |
| 5,094,799 A | * | 3/1992 | Takashige et al. .......... 264/514 |
| 5,166,308 A | | 11/1992 | Kreuz et al. |
| 5,196,500 A | * | 3/1993 | Kreuz et al. ................ 528/125 |
| 5,219,977 A | * | 6/1993 | Kreuz ........................ 528/125 |
| 5,324,475 A | * | 6/1994 | Okahashi et al. ........... 264/555 |
| 5,543,222 A | * | 8/1996 | Edman et al. .............. 428/335 |
| 5,614,141 A | * | 3/1997 | Sumida et al. ......... 264/173.14 |
| 5,667,851 A | * | 9/1997 | Edman et al. ................ 205/95 |
| 6,299,984 B1 | * | 10/2001 | Forloni .................... 428/474.4 |
| 6,565,936 B1 | * | 5/2003 | Peiffer et al. .............. 428/35.9 |
| 6,653,433 B2 | * | 11/2003 | Edman et al. .............. 528/170 |
| 6,696,011 B2 | * | 2/2004 | Yun et al. ................... 264/564 |
| 6,797,801 B2 | * | 9/2004 | Sadanobu et al. .......... 528/170 |

FOREIGN PATENT DOCUMENTS

| | | |
|---|---|---|
| JP | 10-219007 A | 8/1998 |
| JP | 11-222529 A | 8/1999 |

* cited by examiner

Primary Examiner—P. Hampton Hightower

(57) ABSTRACT

The substrates of the present invention comprise a polyimide base polymer derived at least in part from non-rigid rod monomers together with optionally rigid rod monomers where the substrates are cured under low tension. The resulting polyimide materials have been found to provide advantageous properties (e.g. balanced molecular orientation, good dimensional stability, and flatness) particularly useful for electronics type applications.

19 Claims, No Drawings

POLYIMIDE SUBSTRATES HAVING ENHANCED FLATNESS, ISOTROPY AND THERMAL DIMENSIONAL STABILITY, AND METHODS AND COMPOSITIONS RELATING THERETO

FIELD OF THE INVENTION

The present invention relates generally to polyimide substrates useful as dielectric compositions for supporting or fixturing electronic circuits, electronic devices, or the like. In addition, these substrates can be in the form of a film used as an electrically insulative tape, or belt. More specifically, the aromatic polyimide substrates of the present invention: (i.) can be derived from lower cost "non-rigid" monomers, while providing flatness, isotropy and thermal dimensional stability performance otherwise associated with polyimides derived (to a much greater extent) from higher cost "rigid" monomers; or (ii.) can be derived from conventional amounts of such (higher cost) rigid monomers and have improved performance relating to flatness, thermal dimensional stability and isotropy.

BACKGROUND OF THE INVENTION

Broadly speaking, polyimide films have been used as base films in flexible printed circuits ("FPCs"). These films are commonly called substrates. However, the marketplace often demands lower cost and higher FPC performance with each new generation of product, and therefore a long term need exists to lower base film cost while improving properties, particularly dimensional stability and flatness. In other examples of use, the polyimide films (or substrates) of the present invention are used as belts or as insulative tapes for wrapping electrically conductive wire.

Generally, "non-rigid" polyimide monomers are readily available and relatively inexpensive, but such monomers have traditionally formed polyimide substrates having poor dimensional stability. Such poor dimensional stability can cause a polyimide film to be problematic (if not impractical) for FPC applications.

U.S. Pat. No. 4,725,484, to Kumagawa et al., discloses polyimide compositions useful as FPC base films. However, the Kumagawa et al. patent teaches polyimides made from relatively expensive 'rigid type' monomers, such as, biphenyltetracarboxylic dianhydride (BPDA which is a relatively expensive monomer) and p-phenylene diamine (PPD).

SUMMARY OF THE INVENTION

Overview. The present invention is directed to polyimide substrates that can be manufactured by tentering (or other restrained film processing) and can have a relatively low raw material cost due to the use (or increased use) of lower cost non-rigid monomers. The present invention addresses thermal dimensional stability type problems otherwise associated with such substrates. As a result, less expensive non-rigid monomers are now a more viable option for polyimide substrates requiring dimensional stability. Alternatively, the methods of the present invention can be applied to conventional monomer systems as a (previously unknown and unexpected) way to improve film performance, particularly with respect to flatness, dimensional stability and isotropy.

Polyimide Base. The polyimide substrates of the present invention comprise at least a base layer containing a base polymer. "Base polymer" as used herein is intended to mean the dominant polymer component is intended to be at least 25, 30, 35, 40, 45, 50, 55, 60, 65, 70, 75, 80, 85, 90, 95 or 100 weight percent of the overall layer.

The base polymer of the present invention is a polyimide composition synthesized by a poly-condensation reaction, involving the reaction of one or more aromatic diamine components with one or more aromatic dianhydride components. On average, at least 10, 15, 20, 25, 30, 35, 40, 45, 50, 60, 70, 75, 80, 85, 90, 95, 97, 98, 99 or 100 mole percent of the base polymer of the present invention is derived from non-rigid diamine monomer and/or non-rigid dianhydride monomer.

The base layer of the present invention is cured or otherwise processed to a tensile modulus (at 20° C.) greater than 400, 450, 500, 550, 600, 650, 675, 700, 725, 750, 775, 800, 825, or 850 kpsi, while creating an in-plane conformational molecular structure that provides: i. enhanced flatness of the polyimide base layer; ii. minimal anisotropy in the x-y plane; and iii. low thermal dimensional instability.

Enhanced Flatness. In accordance with the present invention, flatness (of the base layer) can be quantified according to 'droop' and 'skew', as follows. To measure droop, a sample (of the base layer) is cut in the transverse ("TD") direction across the entire film width in a way that provides a sample length (in the machine or "MD" direction) of ten times the TD width. The sample film is then laid upon (and supported only by) a substrate (a "droop" table) having intermittent equally spaced (parallel) film supports that extend across the entire TD width of the film. The supports extend across the TD width of the film and are spaced a distance from each other equal to the TD width of the film. The film will then droop (if at all) in the gaps between the supports.

'Droop' is measured at the sample location that exhibits the greatest amount of vertical deflection from the support plane and is measured in parts per million ("ppm"), where the vertical deflection is used as a numerator, the TD length is used as a denominator, and the resulting fraction is multiplied by $(10)^6$. Base films of the present invention have a droop of less than 20,000, 18,000, 16,000, 15,000, 14,000, 13,000, 12,000, 11,000, 10,000, 9,000, 8,000, 7,000, 6,000, 5000, 4000, 3000, 2500, 2000, 1500, 1000, 750 or 500 ppm.

'Skew' is measured by: a. marking the midpoint of each end of the film sample and connecting these two midpoints with a straight line along the entire MD length of the sample; b. marking a (generally non-straight) line that connects the actual TD midpoints along the entire length of the film sample; and c. measuring the greatest TD distance between the two lines (hereafter, "maximum skew distance"). Skew is then quantified by using the maximum skew distance as a numerator, using the MD length of film sample as a denominator, then multiplying the resulting fraction by $(10)^6$ to give ppm (parts per million). Base films of the present invention have a skew less than 10,000, 9,000, 8,000, 7,000, 6,000, 5000, 4,000, 3,000, 2,500, 2,000,1,500, 1,000, 750, 600, 500, 400, 300, or 200 ppm.

Minimal Anisotropy. The minimal anisotropy for the base films of the present invention is further defined as follows:

a. an average linear expansion coefficient of less than 500, 100, 75, 50, 25, 10, 5 or 1 (ppm per ° C.) in a temperature range of 50° C. to 300° C.;

b. a linear expansion coefficient ratio (the machine direction divided by the transverse direction or MD/TD) between (and including) any two of the following numbers: 0.2, 0.4, 0.6, 0.8, 1.0, 1.5, 2.0, 2.5, 3.0, 3.2, 3.4, 3.5, 3.6, 3.8 and 4.0.

Low Thermal Dimensional Instability

Low thermal dimensional instability for the base films of the present invention are further defined as follows: a thermal dimensional stability of less than 1, 0.75, 0.50, 0.30, 0.25, 0.20, 0.10, or 0.05, where thermal dimensional stability is hereby defined as the percent change in length of film (initially at 20° C.) after exposure to 400° C. for at least 1 hour.

DETAILED DESCRIPTION OF THE PREFERRED EMBODIMENT(S)

The present invention is directed to improved polyimide film ('in-plane orientation') isotropy, where the degree of chain axis alignment is, on average, more balanced (in each direction of the film plane) than would be predicted by the prior art. Such polyimide chain alignment (in the film plane) is largely controlled by the amount of external force (e.g., tension) applied to the film at its edges when the film is drying and partially imidized.

Although 'in-plane orientation' isotropy takes into consideration all directions in the film plane (also known as the "x-y plane" of the film), the film directions commonly referred to in the art are:

1. the machine direction (or "MD") which is the direction in the film plane that is 0° relative to the direction of film movement during film manufacture; and
2. the transverse direction (or "TD") which is the direction in the film plane that is 90° relative to the MD direction.

In some embodiments of the present invention, the minimum orientation (with respect to isotropy) can be in a direction other than MD or TD, possibly even half way between the two (i.e., 45° relative to the MD direction).

Film isotropy in accordance with the present invention involves a balance of the film's macro-molecular properties in the x-y plane so that one or more properties of the film (e.g. the coefficient of thermal expansion or tensile strength) is essentially the same in each direction. This can be defined quantitatively as an average variation of less than 25, 20, 15, 12, 10, 8, 7, 6, or 5 percent, when measured (then compared) in each direction (MD and TD) of the x-y plane.

Dimensional stability is a film's tendency to undergo physical dimensional changes in the x-y plane, when exposed to heat or plasticizing chemicals. To quantify, a film sample can be prepared: i. measuring the sample film's length and width; ii. then exposing the film to heat for a minimum of 30 minutes according to IPC TM 650 2.2.4 method A; and iii. then re-measuring and comparing the change in the film sample's length and width.

Polyimides derived (at least in part) from non-rigid polyimide monomers are generally more prone to thermal dimensional stability problems, because the polymer molecules can become locked into elongated conformational states having stored mechanical strain. When the cured film is subsequently heated in downstream processing, this mechanical strain can be released, causing the film to shrink or otherwise change dimensions.

The portions of a polyimide derived from rigid polyimide monomers are generally less prone to thermal dimensional stability problems, because there are fewer (if any) molecular conformational alternatives to take on imposed unwanted (polymer chain) strain. Likewise, such polyimide portions tend to create aligned polymer chains that are less susceptible to stored strain, due to strongly linear (or 'rod-like') chemical bonds in the polymer.

As used herein, an "aromatic" monomer is intended to mean a monomer having at least one aromatic ring, either alone (i.e., a substituted or unsubstituted, functionalized or unfunctionalized benzene or similar-type aromatic ring) or connected to another (aromatic or aliphatic) ring. An aromatic backbone chain segment is intended to mean at least one aromatic moiety between two adjacent imide linkages.

In accordance with conventional practice in discussing and describing polymeric materials, "monomer" is intended to mean not only the monomer per se, but depending upon context, can also mean its wholly or partially reacted form (i.e., the portion of a polymer, oligomer or other polymeric material attributed to such monomers).

As used herein "diamine" is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Dianhydride as used herein is intended to mean the component that reacts with (is complimentary to) the diamine and in combination is capable of reacting to form an intermediate polyamic acid (which can then be cured into a polyimide).

Depending upon context, "anhydride" as used herein can mean not only an anhydride moiety per se, but means also a precursor to an anhydride moiety, such as: (i) a pair of carboxylic acid groups (which can be converted to anhydride by a de-watering or similar-type reaction); or (ii) a carboxylic acid/carboxylic acid ester functionality, and (iii) acid ester functionality (or any other functionality presently known or developed in the future which is capable of conversion to anhydride functionality) or can be used in place of a dianhydride functionality but still results in imide formation when reacted with amines.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

In polyimide synthesis, each polymerized monomer (when polymerized into a polyimide backbone between two other monomers) will generally form nitrogen-benzene imide linkages (on each side of the polymerized monomer). For the aromatic polyimides of the present invention, between the imide linkage pairs will generally be either: (i) a non-rigid moiety, or (ii) a rigid moiety.

The term 'rigid monomer' as used herein is intended to mean a class of aromatic monomers that (when polymerized) form a rigid chain which is conformationally restricted due to steric hindrances, bond angle restrictions, or potential energy barriers. These monomers have no (highly) flexible linkages and when combined with their highly aromatic nature, are generally sterically hindered from large rotations away from the chain axis.

Rigid monomers of the present invention include aromatic monomers having a covalent bond located between two phenyl (rigid) groups. These covalent bonds allow the molecule to rotate, but in contradistinction to the below described non-rigid monomers, rigid monomers do not have a flexible bridging group located between the function end groups of the monomer. If rigid monomers are used in the practice of the present invention (in addition to non-rigid rod monomer), the rigid monomers will tend to contribute to rigidity of the polymer chains and in-plane molecular orientation of the polymer chains. Rigid polymer chain segments generally provide advantageous strength properties to the polymer matrix. The rigid polymer segments will generally have little or no meaningful stored stress, since the rigid segments will generally remain in their relatively low energy state and generally will not unduly bend, twist or kink (will not create undue stored stress) during processing.

Non-rigid monomers of the present invention are those aromatic diamine or aromatic dianhydride monomers containing a (flexible) bridging group along its backbone. Typical (flexible) bridging groups include: —O—, —N(H)—C(O)—, —S—, —SO$_2$—, —C(O)—, —C(O)O—, —C(CH$_3$)$_2$—, —C(CF$_3$)$_2$—, —C(R,R')—, —(CH$_2$)—, —NH(R)— where R and R' are the same or different and are intended to mean any organic group capable of bonding (e.g., to a carbon) as indicated. These bridging groups allow the monomer (including any polymeric material formed therefrom) to change its conformation when exposed to mechanical stress. Examples of common non-rigid monomers include oxydianiline ("ODA"), oxydiphthalic dianhydride ("ODPA"), benzophenone tetracarboxylic dianhydride ("BTDA"), and derivations thereof.

As described above, when a (polymerized) non-rigid monomer is oriented by mechanical stretching or tensioning, alignment (along the polymer chain axis) generally occurs in the (tension) plane. This will generally induce some order and added strength in the plane. Conventional processing techniques generally induce mechanical stored strain, particularly during restrained cooling. Such mechanical strain can cause dimensional instability when the cured film is subsequently heated or solvated sufficient to allow movement (of the non-rigid polymeric segments) back to a lower energy conformation.

Polyimide polymers and polyimide configurations are difficult, and in many cases impossible, to fully verify. Therefore, for purposes of this invention the polyimide polymer and polyimide polymer configuration is defined primarily (if not solely) by the type of monomers used to form the polyimide and by the physical properties of the polyimide composition. The polyimide base polymers of the present invention are derived from a polyamic acid precursor of at least 10 mole percent non-rigid monomer (diamines and/or dianhydrides) in a polymerized, partially polymerized or non-polymerized form. The polyimides of the present invention may contain (or be derived from) up to 1, 2, 3, 4, 5, 10, 15, 20, 25, 30, 35, 40, 45, 50, 55, 60, 65, 70, 75, 80, 85, or 90 mole percent rigid monomer constituents (diamines and/or dianhydrides).

In some embodiments, the polyimide is derived from more than two monomers provided that at least 10 mole percent of the total monomers are non-rigid monomers. Where three or more monomers are used, the monomers can be polymerized together in various proportions using one or more steps.

In accordance with the present invention, "low tension" processing is intended to mean processing with minimal mechanical tension (e.g., tentering) commonly used when processing such films. In one embodiment, the low tension film processing is done in a hot air oven or similar type low mechanical tension heat processing equipment, whereby the tension upon the film in both the machine direction ("MD") and transverse direction ("TD") is as low as practical, or otherwise at least 5, 10, 15, 20, 25, 30, 35, 40, 45, 50, 55, 60, 65, 70, 75 or 80 percent lower in at least one of the two (MD or TD) directions relative to the stress imposed upon a polyimide film during conventional (or typical) tentering processing.

Generally, some amount of machine direction tension may be necessary to pull the film through the process. Regardless, the tension in the MD direction should generally be less than 100, 75, 50, 25, 10, 8, 7, 5, 2, 1, 0.50, 0.10, 0.010, 0.005, or 0.001 pounds force per linear foot of film.

In one embodiment, the machine direction tension is sufficient to move the film through a hot air tunnel, or similar type low tension heating process. TD tension is typically applied substantially only to the extent practical in conveying the film through the process. In this (low tension) curing step, the polyimide film is heated under low tension to a temperature (and for a time) that is sufficient to achieve desired physical properties, by: i. curing the film to a desired level of imidization; and ii. drying the film to a desired (percent solids) state. The film is thereby relaxed and any stored strain (up to that temperature) is largely released.

Such low tension processing is possible without undue loss of film flatness. Moreover, the unwanted stored strain (common in most tentering processes where the film is mechanically tensioned so that the film is made to be flat) can generally be diminished by using a low-tension curing step in accordance with the present invention.

In one embodiment, the polyimide polymers of the present invention are derived from a polyamic acid solution. The polyamic acid solution is derived (at least in part) from non-rigid monomers. The polyamic acid solution can be cast onto a surface and partially imidized or dried. The partially imidized or dried film (also referred herein as a "green" film) can then be pulled under tension in the transverse and machine direction, such as by tentering. The initial pulling of the green film generally induces in-plane orientation that improves physical and mechanical properties of the final film. This pulling can also improve film flatness or other flatness defects, particularly if the stretching is done uniformly and in an effort to achieve isotropy of the molecular orientation in both the MD and TD direction.

After stretching, the green film can be released from the relatively high tension (e.g. tentering) process and can then passed along a hot air, floating bed drier under low tension (relative to the tension used to improve film flatness, at least in the transverse direction), where the remaining polyamic acid can be converted to polyimide and the remaining solvent essentially removed.

In such an embodiment, the film is largely cured from a polyamic acid to a polyimide, and fully dried using relatively low tension. Since the film is relatively unrestrained during the curing step, unwanted mechanical strain is generally not introduced into the polymer network (i.e. undue mechanical stress is generally diminished).

In one embodiment of the present invention, green films are subjected to substantially unrestrained (at least in the transverse direction) curing conditions until a final or substantially final cure is complete. "Final or substantially final cure" is hereby defined as a polyimide film cured to a tensile modulus of greater than 350, 375, 400, 425, 450, 475, 500, 525, 550, 575, 600, 625, 650, 675, 700, 725, 750, 775, 800, 825, or 850 kpsi (at 20° C.).

By curing in this way, a substantially flat, substantially unwrinkled, substantially isotropic, and substantially (thermally and chemically) dimensionally stable film can be created despite the use of economically priced non-rigid monomer constituents, and this generally can be achieved without the need for additional heat stabilization.

Ordinary skill and experimentation regarding hot air (or any similar type low tension heat processing) operation may be necessary to prepare the polyimide films of the present invention. The amount of hot air (or any equivalent low tension) drying required to fully cure a polyimide depends on the particular monomers selected, the solids content of the cast film, and the particular polyimide film manufacturing process selected in the practice of the present invention. It would be impossible to discuss or describe all of the possible polyimide film manufacturing processes useful in the practice of the present invention. Therefore, ordinary skill and experimentation may be necessary in the practice of any particular embodiment of the present invention.

The polyimide films according to the present invention can be produced by combining the above-mentioned non-rigid diamine and dianhydride monomers and optionally up to 90 mole percent of rigid monomers together with a solvent to form a polyamic acid. As used herein a polyamic acid solution is also sometimes referred to as a polyamide acid solution.

To form a polyamic acid, the diamine and dianhydride components are typically combined in a molar ratio of from 0.90 to 1.10. Molecular weight of the polymer formed via the reaction of diamines and dianhydrides can be adjusted by adjusting the molar ratio of the diamine and dianhydride components.

A polyamic acid casting-solution is optionally derived from the polyamic acid solution formed above. The polyamic acid casting solution preferably comprises a polyamic acid combined with conversion chemicals like: (i) one or more dehydrating agents, such as, aliphatic acid anhydrides (acetic anhydride, etc.) and aromatic acid anhydrides; and (ii) one or more catalysts, such as, aliphatic tertiary amines (triethylamine, etc.), aromatic tertiary amines (dimethylaniline, etc) and heterocyclic tertiary amines (pyridine, picoline, isoquinoline, etc). The anhydride dehydrating material it is often used in a slight molar excess of the amount of amide acid groups in the polyamic acid. The amount of acetic anhydride used is typically about 2.0–3.0 moles per equivalent of polyamic acid groups. Generally, a comparable amount of tertiary amine catalyst is used.

In one embodiment, the polyamic acid (casting) solution is dissolved in an appropriate organic solvent at a concentration in any range between (and including any two of the following: 5, 10, 12, 15, 20, 25, 27, 30, 40, 45, 50, 55, 60, 65, 70, 75, 80, 85, or 90% by weight.

Examples of suitable solvents include: sulfoxide solvents (dimethyl sulfoxide, diethyl sulfoxide, etc.), formamide solvents (N,N-dimethylformamide, N,N-diethylformamide, etc.), acetamide solvents (N,N-dimethylacetamide, N,N-diethylacetamide, etc.), pyrrolidone solvents (N-methyl-2-pyrrolidone, N-vinyl-2-pyrrolidone, etc.), phenol solvents (phenol, o-, m- or p-cresol, xylenol, halogenated phenols, catechol, etc.), hexamethylphosphoramide and gamma-butyrolactone.

It is generally desirable to use one of these solvents or mixtures thereof. Alternatively, combinations of these solvents can be used with aromatic hydrocarbons, such as, xylene and toluene, or ether containing solvents like diglyme, propylene glycol methyl ether, propylene glycol, methyl ether acetate, tetrahydrofuran, and or like.

The polyamic acid (casting) solution can further comprise any one of a number of additives, such as, processing aids (e.g., oligomers), antioxidants, light stabilizers, flame retardant additives, anti-static agents, heat stabilizers, ultraviolet absorbing agents, inorganic fillers or various reinforcing agents.

The polyamic acid casting-solution can be cast or otherwise applied onto a support, such as an endless belt or rotating drum, to give a film. Next, the resulting (solvent containing) film can be converted into a self-supporting film by baking (while supported) at an appropriate temperature, optionally but preferably together with conventional or non-conventional polyimide conversion chemical reactants. Generally, the film can then be separated from the support and molecularly oriented in both the transverse and machine directions by stretching during a first stage tentering process. Optionally, the film is subjected to additional drying during such first stage tentering. Then in accordance with the present invention, the polyamic acid film is largely thermally and/or chemically cured to a polyimide using little to no transverse and machine direction stretching to form a polyimide film with excellent thermal dimensional stability and flatness.

Numerous variations are also possible, such as: (a) a method where the diamine components and dianhydride components are preliminarily mixed together and then the mixture is added in portions to a solvent while stirring, (b) a method where a solvent is added to a stirring mixture of diamine and dianhydride components (contrary to (a) above), (c) a method where diamines are exclusively dissolved in a solvent and then dianhydrides are added thereto at such a ratio as allowing to control the reaction rate, (d) a method where the dianhydride components are exclusively dissolved in a solvent and then amine components are added thereto at such a ratio to allow control of the reaction rate, (e) a method where the diamine components and the dianhydride components are separately dissolved in solvents and then these solutions are mixed in a reactor, (f) a method where the polyamic acid with excessive amine component and another polyamic acid with excessive dianhydride component are preliminarily formed and then reacted with each other in a reactor, particularly in such a way as to create a non-random or block copolymer, (g) a method where a specific portion of the amine components and the dianhydride components are first reacted and then the residual diamine components are reacted, or vice versa, (h) a method wherein the conversion chemicals are mixed with the polyamic acid to form a polyamic acid casting-solution and then cast to form a gel film, (i) a method where the components are added in part or in whole in any order to either part or whole of the solvent, also where part or all of any component can be added as a solution in part or all of the solvent, (j) a method of first reacting one of the dianhydride components with one of the diamine components giving a first polyamic acid and then reacting the other dianhydride component with the other amine component to give a second polyamic acid and finally combining the amic acids in any one of a number of ways prior to film formation.

The polyimide film thickness may be adjusted, depending upon the intended purpose of the film or final application specifications. It is generally preferred that the thickness of the film be in a range between (and including) any two of the following thicknesses 1, 2, 3, 5, 7, 8, 10, 12, 15, 20, 25, 30, 35, 40, 45, 50, 60, 80, 100, 125, 150, 175, 200, 300, 400 and 500 microns. In one embodiment, the thickness of the polyimide film is from eight to about 125 microns.

In one embodiment, a pyromellitic dianhydride and 4,4-oxydianiline can be dissolved in an organic polar solvent such as N,N-dimethylacetamide or N-methyl-2-pyrrolidone. The resulting solution can be heated at a temperature of about 10° C. to 80° C., for a period of about 1 to 30 hours, to undergoing polymerization of the monomers. A solution of polyamic acid can thus be obtained. The polyamic acid solution can contain 20 weight percent solids compared to solvent. The polyamic acid solution can have a rotary viscosity (Brookfield®) at 30° C. of about 2,500 poise±100, 200, 250, 300, 400, 450, 500, 550, 600, 650, 700, 750, 800, 850, 900, 950 or 1000 poise. In this embodiment, the polyamic acid can have a percent imidization ratio of no more than about 5, 6, 7, 8, 9, or 10 percent and an inherent viscosity (at 30° C. and concentration of 0.5 g/100 ml in N-methyl-2-pyrrolidone) of about from 1.6–2.0. The polyamic acid solution can be converted to a polyamic acid casting solution per the above described method and coated or spread on a metal surface, such as a drum, to give a coated solution layer. The coated solution layer can be partially imidized, and partially dried to about 35 weight percent solids to form a gel film. The gel film can then peeled from the metal surface and fed into a first stage of drying using a tenter curing oven.

In the first stage of curing, the film can be unsupported and transported by pulling the film in the machine direction by a winding apparatus located at the end of the curing oven. The chain speed of the curing oven can be controlled, so the curing oven operates at a speed faster than the casting drum. In this way, stretching of the film in the machine direction can be caused by the pulling force of the curing oven's (film) wind-up apparatus. The film can undergo an elongation in the machine direction that is controlled by the magnitude of the difference between the speed of the curing oven wind-up apparatus and the casting drum. This machine direction elongation can induce a molecular orientation of the polymer chains in the machine direction.

For polyimide films that contain non-rigid monomers at a quantity greater than 25 mole percent, some molecular orientation is generally necessary to produce a high modulus polyimide film. In such an embodiment, the film can be restrained primarily in the MD direction during the first stage of curing (which can be conducted at ambient conditions), and during this stage, some imidization and drying can occur.

In the second stage of curing, convection drying can be employed. At this time, the film can be restrained (e.g., tentered) for the first time in the transverse direction. During the second stage of curing, the film can be heated using hot air, or optionally nitrogen, to a temperature of about 245° C. to about 285° C. The film can then be dried from about 40–50 (weight solids) percent to about 90–95 (weight solids) percent. In this stage of curing, the polymer chains are generally molecularly oriented in the transverse direction by two mechanisms—one mechanism being physical and the second being chemical.

The first mechanism of TD polymer chain orientation can be caused by a controlled increase in the distance between the curing oven (tenter) chains holding the film at the edges as the film moves through the oven. This physical drawing of the film can orient the polymer chains in the TD direction. The second mechanism of transverse molecular orientation can be caused by the drying of the film and the film's actual shrinkage (induced by drying). Thus, after the second stage of curing is complete, non-rigid polymer chains can be oriented in both the machine and transverse direction. Machine or transverse direction orientation (MD/TD) is commonly referred to as "X-Y orientation" or "in-plane" orientation.

After molecular orientation, the film can then be exposed to (third stage) high heat curing. During this third stage of curing, the film can be heated to within any range between (and including) any two of the following temperatures: 350, 375, 400, 410, 420, 430, 440, 450, 460, 470, 480, 490 and 500, 510, 520, 530, 540, 550, 560, 570, 580, 590 and 600° C. In one embodiment, the green film is heated to within a range of from 400 to 440° C. to induce full imidization of the polyamic acid. In this embodiment, the remainder of imidization takes place as well as the remainder of the drying process. Preferably, the film is left unrestrained as much as possible during this stage of curing (i.e., the high temperature curing stage). Where tentering is used, the edge restraints (clips holding the film in the transverse direction) are preferably removed. While some small amount of additional machine direction tension is oftentimes unavoidable so that the film may be pulled through the machine, the amount of tension in the MD direction is generally kept as low as practical.

In one embodiment, the third stage of curing is carried out in such a manner that the film is fed into a (low-tension) hot air drying zone. During this stage, the film is passed through the high heating zones while the film is lying on a bed of hot air. The machine typically employed to perform this type of drying/curing is commonly referred to as a floating airbed drier. In some embodiments, minor restraint of the film is required in the transverse direction as well as the MD direction to simply hold the film in place while it is floating on the airbed.

Since the film can be molecularly oriented in both the machine and transverse direction prior to full imidization, further orientation is generally not required. In fact, further orientation is generally not advisable since most of the imidization is now complete and the chain structure is generally sufficiently rigid. If the amount of orientation in the machine direction from stage one, and the transverse direction during stage two is substantially about equal, the film can generally be considered highly "isotropic" for purposes of the present invention. It is highly desirable for the films of the present invention to have a high degree of isotropy (i.e. contain substantially the same amount of molecular orientation in all directions of the x-y plane, including both the machine and transverse directions). Such highly isotropic films are generally easier to process for electronics type applications, where high temperature processing can otherwise cause unwanted distortion of the film.

During the third stage of curing the remaining volatiles are generally (largely) removed and the film is dried from about 95 weight percent solids to greater than 99.0, 99.1, 99.2, 99.3, 99.4, 99.5, 99.6, 99.7, 99.8, 99.9, and 99.99% solids. By regulating the maximum temperature of the hot air, it is generally possible to obtain a polyimide film that has excellent mechanical strength, adhesive strength, and dimensional stability. It is preferable at this stage that the polyimide film be exposed to the maximum heating temperature within a range from about 1, 2, 3, 5, 10, 15, 20, 25, 30, 35, 40, 45 or 50 seconds to about 60, 70, 80, 90, 100, 200, 400, 500, 700, 800, 900, 1000, 1100 or 1200 seconds. In one embodiment, the third stage heating temperature of the hot air floating bed may generally be set to ramp up temperature from 300, 350, 375, 400, 425, 450, 475, 500, 525, 550, 575, and 600° C. or more, while varying the speed in which the film is passed through the oven.

Polyimides produced by the methods herein have remarkably high film color, specifically L*color. L*color is a measure of darkness on a scale ranging from zero to 100. Zero is considered black and 100 white. An example of this color change is shown using a 2 mil thick polyimide film comprising the reaction product of pyromellitic dianhydride (PMDA) and 4,4'-diaminodiphenyl ether (4,4'-ODA). This polyimide film, made in accordance with the present invention, showed an L*color of 65. The same polyimide film composition made using a conventional tenter (curing) process, showed an L*color of only 62.9. It is important to note that many conventional films are further heated after curing (a step commonly called post-treatment) to stabilize the film's thermal dimensional stability. After a typical post treatment heat step the conventionally processed film showed an L*color of 58.6. These lower L*color values would be expected for other polyimides as well, however the absolute value of L*color would depend on the monomers used to form the polyimide and the exposure to time at temperature. To summarize, polyimide films produced using the processes of the present invention will show higher L*color values compared to same films made using conventional curing and, more particularly, film that are conventionally cured and post heat-treated.

The polyimide films according to the present invention can be used as a base film for a laminate for incorporation into a flexible printed circuit board ("FPC"). In one embodiment, a flexible printed circuit board ("FPC") can be produced as follows:

1. applying an adhesive (onto the polyimide film of the present invention) and drying;
2. laminating a copper or other conductive foil;
3. hardening the adhesive; and
4. forming a circuit pattern (broadly speaking: application of a resist, photo-patterning and development of the resist, copper etching and removal of the resist).

Examples of adhesives useful in forming the adhesive layer include thermoplastic polyimide resins, epoxy resins, phenolic resins, melamine resins, acrylic resins, cyanate resins and combinations thereof. In one embodiment, the adhesive is a polyimide thermoplastic resin, optionally further comprising a thermosetting adhesive, such as, epoxy resin and/or phenolic resin.

Alternatively, the polyimide films of the present invention can be sputtered with a metal, or a metal foil and polymer layer can be bonded together using an adhesive by applying high heat and pressure to form a flexible laminate.

The flexible laminates formed in this manner should have high dimensional stability, by using the polyimide films of the present invention as well as matching the coefficient of thermal expansion (CTE) to copper and other conductive materials.

The adhesion strength of the above-described laminates can be improved by employing various techniques for elevating adhesion strength. For example, prior to the step of applying the adhesive onto the polyimide film or laminating an adhesive sheet thereon, the polyimide films of the present invention can be subjected to a pre-treatment step (corona treatment, plasma treatment under atmospheric pressure, plasma treatment under reduced pressure, treatment with coupling agents (like polyamic acids oligomers and silanes), sandblasting, alkali-treatment, and acid-treatment.

To improve the adhesion strength, it is generally also possible to add various metal compounds as disclosed, for example, in U.S. Pat. Nos. 4,742,099: 5,272,149: 5,218,034: 5,227,244: 5,543,222 incorporated herein by reference, (tin compounds, titanium compounds, etc.) to the polyamide acid or to apply various metal compound solutions onto the gel film.

EXAMPLES

The present invention is further described by the following examples. Unless indicated otherwise, each examination was made using multiple samples to thereby obtain an average value. Thermal dimensional stability data is represent in the tables below. Data was recorded at three temperatures, 200° C., 300° C., and 400° C.

Example 1

A polyamic acid of pyromellitic dianhydride (PMDA) and 4,4-diaminodiphenylether (4,4'-ODA) was prepared in a 20 weight percent solution of dimethylacetamide (DMAc). The reaction was polymerized to 99.5% stoichiometry. The polyamic acid solution had a viscosity of 2300 poise. Conversion chemicals were added consisting of about 2.6 moles of acetic anhydride and 2.5 moles of beta-picoline (both dissolved in DMAc) to form a 15 weight percent polyamic acid casting-solution at zero to −5° C. The polyamic acid was cast onto a drum having a surface temperature of 90° C. The polyamic acid film was stripped off the drum at 15–20 weight percent solids having undergone some imidization. The film was stretched in the machine direction by a factor or 1.17. The film was pinned on tenter frame and stretched to about 1.30 in the transverse direction in an effort to achieve orientation isotropy. During transverse directional stretching, the film was also heated about 260° C. with hot air. After this heating and stretching step, the film was dried to about 93 to 95 weight percent solids. The film was then removed from tenter clips and cured (and dried) to a polyimide using hot air at a temperature of about 400° C. for about 2 min, and then 440° C. for an additional 2 minutes. The final film had a Young's modulus of 462.7 and had a dimensional stability of about −0.07 percent in the machine direction and −0.04 percent in the transverse direction when heated to a temperature of 200° C. over 1 hour.

Example 2

A polyamic acid of pyromellitic dianhydride (PMDA) and 4,4-diaminodiphenylether (4,4'-ODA) was prepared in a 20 weight percent solution of dimethylacetamide (DMAc). The reaction was allowed to polymerized to 99.5% stoichiometry. The polyamic acid solution had a viscosity of 2300 poise. Conversion chemicals added consisting of about 2.6 moles of acetic anhydride and 2.5 moles of beta-picoline (both dissolved in DMAc) to form a 15 weight percent polyamic acid casting-solution. The polyamic acid was cast onto a drum having a surface temperature of 90°C. The polyamic acid film was stripped off the drum at 15–20 weight percent solids having undergone some imidization. The film was stretched in the machine direction by a factor or 1.23. The film was pinned on tenter frame and stretched to about 1.31 in the transverse direction in an effort to achieve orientation isotropy. During transverse directional stretching, the film was also heated about 260° C. with hot air. After this heating and stretching step, the film was dried to about 93 to 95 weight percent solids. The film was then removed from tenter clips and cured (and dried) to a polyimide using hot air at a temperature of about 400° C. for about 2 min, and then 440° C. for an additional 2 minutes. The final film had a Young's modulus of about 470° C. and had a dimensional stability of about −0.06 percent in the machine direction and −0.02 percent in the transverse direction when heated to a temperature of 200° C. over 1 hour.

Comparative Example 1

A polyamic acid of pyromellitic dianhydride (PMDA) and 4,4-diaminodiphenylether (4,4'-ODA) was prepared in a 21.7 weight percent solution of dimethylacetamide (DMAc). The reaction was allowed to polymerized to 99.5% stoichiometry. The polyamic acid solution had a viscosity of 2300 poise. Conversion chemicals added consisting of about 2.6 moles of acetic anhydride and 2.5 moles of beta-picoline (both dissolved in DMAC) to form a 15 weight percent polyamic acid casting-solution. The polyamic acid was cast onto a drum having a surface temperature of 90°C. The polyamic acid film was stripped off the drum at 15–20 weight percent solids having undergone some imidization. The film was stretched in the machine direction by a factor or 1.15. The film was pinned on tenter frame and stretched to about 1.2, in the transverse direction using a tenter chain. During transverse directional stretching, the film was also heated about 260° C. with hot air. After this heating and stretching step, the film was dried to about 93 to 95 weight percent solids. Then, the film was retained under restraint and cured (and dried) to a polyimide using radiant heat for 40–120 seconds. The final film had a Young's modulus of about 445 kpsi and had a dimensional stability of about −0.2% in the machine direction and −0.1% in the transverse direction when heated to a temperature of 200 over 1 hour.

Comparative Example 2

A polyamic acid of pyromellitic dianhydride (PMDA) and 4,4-diaminodiphenylether (4,4'-ODA) was prepared in a 21.7 weight percent solution of dimethylacetamide (DMAc). The reaction was allowed to polymerized to 99.5% stoichiometry. The polyamic acid solution had a viscosity of 2300 poise. Conversion chemicals added consisting of about 2.6 moles of acetic anhydride and 2.5 moles of beta-picoline (both dissolved in DMAc) to form a 15 weight percent polyamic acid casting-solution. The polyamic acid was cast onto a drum having a surface temperature of 90° C. The polyamic acid film was stripped off the drum at 15–20 weight percent solids having undergone some imidization. The film was stretched in the machine direction by a factor or 1.15. The film was pinned on tenter frame and stretched to about 1.20, in the transverse direction using a tenter chain. During transverse directional stretching, the film was also heated about 260° C. with hot air. After this heating and stretching step, the film was dried to about 93 to 95 weight percent solids. Then, the film was retained under restraint and cured (and dried) to a polyimide using radiant heat for 40–120 seconds. The fully cured film was then heat stabilized, to a temperature from 250–270° C., in a post treatment process. In this stabilization oven, the film was subjected to very low tension in order to enable the film to relax out any stored strains developed during the previous processing. The final film had a Young's modulus of about 445 kpsi and had a dimensional stability of about −0.04% in the machine direction and −0.03% in the transverse direction when heated to a temperature of 200 over 1 hour.

|  | MD | TD |
|---|---|---|
| 400 C. thermal exposure | | |
| Comparative example 1 | −0.66% | −1.11% |
| Comparative example 2 | −0.68% | −0.71% |
| Example 1 | −0.27% | −0.11% |
| Example 2 | −0.22% | −0.10% |
| 300 C. thermal exposure | | |
| Comparative example 1 | −0.31% | −0.56% |
| Comparative example 2 | −0.21% | −0.09% |
| Example 1 | −0.06% | −0.02% |
| Example 2 | −0.11% | −0.05% |
| 200 C. thermal exposure | | |
| Comparative example 1 | −0.20% | −0.10% |
| Comparative example 2 | −0.04% | −0.03% |
| Example 1 | −0.07% | −0.04% |
| Example 2 | −0.06% | −0.02% |

What is claimed is:

1. A polyimide substrate comprising:
   at least a base layer containing a base polymer;
   the base polymer being a polyimide synthesized by a multiple reaction involving one or more aromatic diamines and one or more aromatic dianhydrides, the multiple reaction comprising a polymerization reaction and an imidization reaction, at least a portion of the polymerization reaction being conducted in a high tension film processing environment and at least a portion of the imidization reaction being conducted in a low tension film processing environment, the low tension film processing environment occurring after the high tension film processing environment, the film processing environments being conducted in a manner sufficient to enable a polyimide substrate having:
   A. a tensile modulus (at 20° C.) greater than 350, 400, 450, 500, 550, 600, 650, 675, 700, 725, 750, 775, 800, 825, or 850 kpsi,
   B. a droop of less than 20,000, 18,000, 16,000, 15,000, 14,000, 13,000,12,000, 11,000, 10,000, 9,000, 8,000, 7,000, 6,000, 5000, 4,000, 3,000, 2500, 2000, 1500, 1000, 750 or 500 ppm,
   C. a skew less than 10,000, 9,000, 8,000, 7,000, 6,000, 5000, 4,000, 3,000, 2500, 2000, 1500, 1000, 750, 600, 500, 400, 300, or 200 ppm,
   D. an average linear thermal expansion coefficient of less than 500, 250, 100, 75, 50, 25, 10, 5 or 1 (ppm per ° C.) in a temperature range of 50° C. to 300° C.,
   E. a linear expansion coefficient ratio (MD/TD) between (and including) any two of the following numbers: 0.2, 0.4, 0.6, 0.8, 1.0, 1.5, 2.0, 2.5, 3.0, 3.2, 3.4, 3.5, 3.6, 3.8 and 4.0; and
   F. a thermal dimensional stability of less than 1, 0.75, 0.50, 0.30, 0.25, 0.20, 0.10, or 0.05, where thermal dimensional stability is hereby defined as the percent change in length of film (initially at 20° C.) after exposure to 400° C. for at least 1 hour.
2. A polyimide substrate in accordance with claim 1, wherein at least 10, 20, 25, 30, 35, 40, 45, 50, 60, 70, 75, 80, 85, 90, 95, 97, 98, 99 or 100 mole percent of the base polymer is derived from:
i. non-rigid diamine monomer;
ii. non-rigid dianhydride monomer; or
iii. a combination of (i.) and (ii),
and the balance being optionally derived from a rigid monomer.

3. A polyimide substrate in accordance with claim 1, wherein at least 10, 20, 25, 30, 40, 50, 60, 70, 75, 80, 90, 95 or 100 mole percent of the non-rigid monomers have at least one moiety having a flexible bond between a first and a second aromatic group and wherein the polyimide is derived from both rigid monomer and non-rigid monomer.

4. A polyimide substrate in accordance with claim 3, wherein the flexible bridging group is a member of a group consisting of: —O—, —N(H)—C(O)—, —S—, —SO$_2$—, —C(O)—, —C(O)O—, —C(CH$_3$)$_2$—, —C(CF$_3$)$_2$—, and —C(R,R')—, —CH$_2$—, —NH—R—, where R and R' are the same or different and are any organic group capable of bonding as indicated.

5. A polyimide substrate in accordance with claim 1, wherein at least 10, 20, 30, 40, 50, 60, 70, 80, 90 95, 98, or 100 mole percent of the non-rigid monomer comprises oxydianiline, oxydiphthalic anhydride or a derivation of either.

6. A polyimide substrate in accordance with claim 1, wherein up to 0, 2, 5, 10, 15, 20, 25, 30, 35, 40, 45, 50, 55, 60, 65, 70, 75, 80, 85, or 90 mole percent of the aromatic diamine or aromatic dianhydride is a rigid monomer.

7. A polyimide substrate in accordance with claim 1, wherein the substrate has a thickness in a range between (and including) any two of the following thicknesses: 1, 2, 3, 5, 7, 8, 10, 12, 15, 20, 25, 30, 35, 40, 45, 50, 60, 80, 100, 125, 150, 175, 200, 300, 400 and 500 microns.

8. A process for manufacturing a dimensionally stable polyimide film, comprising:
(a) creating an amic acid solution in one or more steps by contacting a plurality of non-rigid monomers and optionally a plurality of rigid monomers together in one or more steps in a mole ratio of A:B, where
i. A represents non-rigid monomers in a first range, the first range being any range between and including any two of the following numbers: 10, 15, 20, 25, 30, 35, 40, 45, 50, 55, 60, 65, 70, 75, 80, 85, 90, 95, 97, 98, 99, and 100, and
ii. B represents rigid monomers in a second range, the second range being any range between and including any two of the following numbers: 90, 85, 80, 75, 70, 65, 60, 55, 50, 45, 40, 35, 30, 25, 20, 15, and 10, and
the amic acid solution further comprising an organic solvent, a dehydrating agent and a catalyst;
(b.) applying the amic acid solution to a support to provide a film,
(c.) restraining the film in a machine direction and drawing the film by a factor greater than 1.1,
(d.) separately from (before or after c.) or concomitant with (c.) restraining the film in a transverse direction and drawing the film by a factor greater than 1.1,
(e.) thereafter drying the resulting composition to a solids content of greater than 90 weight percent by heating the film above 200, 225, 250, 275 or 300° C.;
thereafter curing the resulting composition to a solids content greater than 98 weight percent and to an imidization level greater than 90% by heating the film above 325, 350, 375, 400, 425, 450, 475, 500, 525, 550° C. without undue restraint in the machine and transverse direction.

9. The substrate of claim 1 further comprising a metal layer.

10. The substrate of claim 9 wherein the base layer and the metal layer are bonded using an adhesive.

11. The substrate of claim 10 wherein the adhesive comprises one or more of the following functional groups: acrylic, imide, melamine, urethane, phenolic, cyanate and epoxy.

12. A substrate in accordance with claim 1, further comprising an upper metal layer and a lower metal layer, wherein the upper metal layer is bonded to a first side of the base layer or the polyimide substrate and the lower metal layer is bonded to an opposite side of the base layer or the polyimide substrate.

13. A substrate in accordance with claim 12, wherein the upper metal layer and the lower metal layer are bonded to the base layer or polyimide substrate using an adhesive.

14. A substrate in accordance with claim 13, wherein the metal layer is vapor deposited or sputtered directly onto the base layer or polyimide substrate.

15. A substrate in accordance with claim 14, wherein the metal is also electroplated to the base layer or the polyimide substrate after sputtering or vapor depositing.

16. A substrate in accordance with claim 1, wherein at least one face of said base layer or polyimide substrate is subjected to at least one treatment comprising at least one of the following processes: heating, crosslinking with a crosslink additive, subjecting to a corona discharge, subjecting to a plasma field, adding an oligomer, adding a polymer coating, or adding a coupling agent.

17. A substrate in accordance with claim 1, whereby the substrate is at least a portion of a high density package from the group consisting of:
a chip on lead ("COL") package, chip on flex ("COF"), a lead on chip ("LOC") package, a multi-chip module ("MCM"), a ball grid array ("BGA" or "μ-BGA") package, chip scale package ("CSP") and a tape automated bonding ("TAB") package.

18. A substrate in accordance with claim 1, further comprising:
(i) a conductive layer having a thickness of less than 100 microns, and
(ii) a wafer comprising a plurality of integrated circuit dies.

19. A substrate in accordance with claim 1, further comprising a conductive passageway, said passageway comprising one or more of the following group consisting of: a wire bond, a conductive metal, and a solder bump.

* * * * *